United States Patent [19]

Hirabayashi

[11] Patent Number: 5,614,445
[45] Date of Patent: Mar. 25, 1997

[54] METHOD OF DICING SEMICONDUCTOR WAFER

[75] Inventor: Atsuo Hirabayashi, Kanagawa, Japan

[73] Assignee: Fuji Electric Co., Ltd., Kanagawa, Japan

[21] Appl. No.: 863,677

[22] Filed: Apr. 1, 1992

[30] Foreign Application Priority Data

Apr. 2, 1991 [JP] Japan ..................... 3-068664

[51] Int. Cl.⁶ ............................................. H01L 21/301
[52] U.S. Cl. ........................................ 437/226; 437/227
[58] Field of Search ............................. 156/644; 437/65, 437/67, 226, 227

[56] References Cited

U.S. PATENT DOCUMENTS

| | | | |
|---|---|---|---|
| 4,916,087 | 4/1990 | Tateoka et al. | 437/229 |
| 4,922,318 | 5/1990 | Thomas et al. | 357/43 |
| 5,023,188 | 6/1991 | Tanaka . | |

FOREIGN PATENT DOCUMENTS

| | | |
|---|---|---|
| 0363179 | 4/1990 | European Pat. Off. . |
| 59-43557 | 3/1984 | Japan . |
| 1-36065 | 2/1989 | Japan . |
| 1-290235 | 11/1989 | Japan . |

OTHER PUBLICATIONS

Gottscho, R. et al, "Microscopic Uniformity in Plasma Etching", J. Vac. & Tech. (B) 10(5), Sep. 10, 1992, pp. 2133–2147.

Primary Examiner—George Fourson
Attorney, Agent, or Firm—Finnegan, Henderson, Farabow, Garrett & Dunner, L.L.P.

[57] ABSTRACT

A process for manufacturing a semiconductor device is described comprising the steps of providing window openings in a photoresist mask layer for forming trench grooves on the surface of a $p^+$-type epitaxial silicon wafer where an integrated circuit is subsequently formed; providing window openings in the photoresist mask layer for forming dummy etched grooves in a scribe line zone on the wafer; and performing dry etching to remove material exposed by the window openings. The sum of the areas to be etched by dry etching accounts for not less than 5% of the total surface area on one side of the $p^+$-type silicon wafer. Trench grooves are formed in the integrated circuit region of the wafer and dummy etched grooves are formed in a scribe line zone of the wafer. Both the trench grooves and the dummy etched grooves are filled with polycrystalline silicon to provide a smooth wafer surface. The wafer is then cleaved along the scribe line zone. Accordingly, a high density of circuit elements can be realized by forming microminiature etching sections in a stable configuration while preventing side etching during the dry etching processing step. The semiconductor device resulting from the disclosed process is also described.

4 Claims, 6 Drawing Sheets

METHOD OF DICING SEMICONDUCTOR WAFER

BACKGROUND OF THE INVENTION

1. Field of the Invention

The present invention relates to a process of producing a semiconductor device; and more particularly, to a dry etching technique for patterning small geometries.

2. Discussion of the Related Art

Etching techniques in conjunction with lithography are important for producing denser and smaller semiconductor devices. Dry etching techniques have been developed for the manufacture of semiconductor devices having reduced dimensions. FIGS. 9–12 show a known method of producing CMOS-FETs with dry etching. This method will be described below.

FIG. 9 illustrates a $p^+$-type (high impurity concentration p-type) silicon wafer 21 and a $p^-$-type (low impurity concentration p-type) epitaxial layer 22 formed thereon. Photoresist layer 23 is disposed on $p^-$-type epitaxial layer 22. Window openings 24' are provided in photoresist layer 23 for forming trench grooves that will facilitate element separation isolation.

Photoresist layer 23 serves as a mask layer, such that exposed portions of $p^-$-type epitaxial layer 22 in window openings 24' are plasma etched. As a result, trench grooves 24 are formed in $p^-$-type epitaxial layer 22 as shown in FIG. 10. Boron ions are injected onto the bottoms of the trench grooves 24 to form channel stop or channel cut layer 25 (shown in FIG. 11).

As further seen in FIG. 11, sidewall insulating film 26 is then formed on the inner sidewall of each trench groove 24 after channel stop layer 25 has been formed. Trench grooves 24 are also filled with polycrystalline silicon 27. Subsequently, photoresist layer 23a is disposed on $p^-$-type epitaxial layer 22. Photoresist layer 23 is patterned to form window openings 28'. Phosphorus ions are injected (i.e., implanted) into window openings 28' to form n-type well regions 28 (FIG. 12) in which p-channel MOS transistors will be formed.

After n-wells 28 are formed by ion implantation as shown in FIG. 12, $p^+$-type source and drain regions 29a and 30a are formed in each n-well 28. On the other hand, $n^+$-type source and drain regions 29b and 30b of n-channel transistor 35b are formed in $p^-$-type epitaxial layer 22. In addition, gate oxide films 31a and 31b, gate electrodes 32a and 32b, and layer-to-layer insulating films 33a, 33b and 33c are formed on the surface of $p^-$-type epitaxial layer 22. Then aluminum electrodes 34a, 34b, 34c, 34d, 34e and 34f are connected to the source, gate and drain of the p-channel transistors and the drain, gate and source of the n-channel transistors, respectively. As a result, p-channel MOS transistors 35a and n-channel MOS transistors 35b are formed having appropriate electrical connections.

A number of semiconductor devices 35 each having p-channel MOS transistors 35a and n-channel MOS transistor 35b are formed on $p^+$-type silicon wafer 21. Semiconductor devices 35 are isolated from one another via a scribe line zones 36 which are used for cleaving (cutting and dividing) $p^+$-type silicon wafer 21.

However, the areas subjected to plasma etching correspond only to window openings 24' where trench grooves 24 are formed. These areas account for a very small percentage of the total surface area on one side of the $p^+$-type silicon wafer. If plasma etching is performed in an atmosphere containing chlorine or fluorine, the ratio of the etched area to the concentration of ions or radicals (used as etching species) will tend to be very low. Consequently, the directional selectivity of the etching will be reduced.

As a result, the etched area must be increased, thereby increasing the area separating the p-channel MOS transistor 35a from n-channel MOS transistor 35b. The area between the n- and p-channel MOS transistors is further increased because etching also extends in the direction of the sidewall of trench groove 24 (i.e., side etching) occurs. Accordingly, it has become difficult to increase device density when a dry etching process is used.

SUMMARY OF THE INVENTION

In view of the foregoing, an object of the present invention is to produce a semiconductor device having microminiature etching sections and a uniform etching pattern by regulating the balance between the concentration of etching species in a dry etching atmosphere and an area to be etched. A further object of the present invention is to overcome the above problems associated with prior art dry etching processes.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, as embodied and broadly described herein, a process for manufacturing a semiconductor device comprising the steps of the invention comprises the steps of: disposing a mask layer on a first surface region and a second surface region of a semiconductor substrate, said semiconductor substrate having a total surface area; forming a first window in said mask layer exposing a first portion of said first surface region of said semiconductor substrate; forming a second window in said mask layer exposing a second portion of said second surface region of said semiconductor substrate; removing material of said semiconductor substrate from said first and second portions exposed by said first and second windows to form a first groove in said semiconductor substrate corresponding to said first portion and a second groove corresponding to said second portion; and forming an integrated circuit only in said first surface region.

In another aspect, a semiconductor device of the present invention comprises a semiconductor substrate having a major surface and a first surface region formed in said major surface and a second surface region formed in said major surface, said major surface having a total surface area; a plurality of first grooves formed in a portion of said first surface region and a plurality of second grooves formed in a portion of said second surface region; and an integrated circuit formed in said first surface region in a portion other than said portion of said first surface region.

According to the present invention, a process for producing a semiconductor device comprises at least the steps of forming a mask layer having windows to expose etching sections in element formation zones on the surface of a semiconductor wafer and to expose dummy etching sections in a zone other than the element formation zones. The process according to the present invention further comprises the step of carrying out dry etching in the sections having the windows made in the surface of the semiconductor wafer.

According to a preferred embodiment, the dummy etching sections are provided in a scribe line zone dividing the semiconductor wafer.

Moreover, in order to suppress side etching, the windows are preferably made such that the sum of the areas (as defined by the mask layer) of the etching sections in the element formation zones and the areas of the dummy etching sections account for not less than 5% of the whole area on one side of the semiconductor wafer.

The process according to present invention preferably includes the step of filling up the dummy etching sections, after etching has been performed, in order to prevent unevenness in the wafer surface. Such unevenness may have a deleterious effect in secondary processes, such as forming the n-well regions.

Consequently, it is preferred that the etching sections in the element formation zones should be formed into trench grooves, for instance. In addition, the step of filling up the trench grooves is utilized for filling up the dummy etching sections.

Preferably, each dummy etching section may be formed into a line of grooves having a width substantially equal to the width of the trench groove.

In the process of producing the semiconductor device according to the present invention, the mask layer is formed so that windows have been made in the etching sections of the element formation zones on the surface of the semiconductor wafer. In addition, windows are made in the dummy etching sections to be provided in a zone other than the element formation zones on the semiconductor wafer. Then, dry etching is carried out in all the sections having windows made in the surface of the semiconductor wafer. Therefore, the total area processed by dry etching is the sum of the areas of the etching sections in the element formation zones and the areas of the dummy etching sections. Accordingly, the total area etched is increased. Therefore, the ratio of the area to be etched to the concentration of ion or radical etching species can also be increased. As a result, the directivity of dry etching is improved and side etching is reduced. Thus, microminiature etching sections with a stable etching configuration can be made so that a scheme for high-density integration of circuit elements can be implemented.

Since dummy etching sections are formed in the scribe line zone dividing the semiconductor devices, it is unnecessary to form another zone for forming dummy etching sections. Thus, although the area occupied by the dummy etching sections is large, the element formation zones are not affected. This process permits large scale integration of semiconductor devices, in particular CMOS devices.

If the step of filling up the trench grooves is also utilized for filling the dummy etching sections, the surface of the wafer including dummy etching sections can be made flat without any additional processing steps.

When the dummy etching sections are formed into grooves having substantially the same width and depth as the trench grooves, the dummy etching sections and the trench grooves can be filled simultaneously and completely, so that the entire surface of the wafer is made flat.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

DESCRIPTION OF THE PREFERRED EMBODIMENTS

Reference will now be made in detail to the present preferred embodiments of the invention, examples of which are illustrated in the accompanying drawings. Wherever possible, the same reference numbers will be used throughout the drawings to refer to the same or like parts.

A description will be given of a process for producing a semiconductor device (e.g., CMOS-FETs) embodying the present invention with reference to FIGS. 1 to 4.

Figure 1:
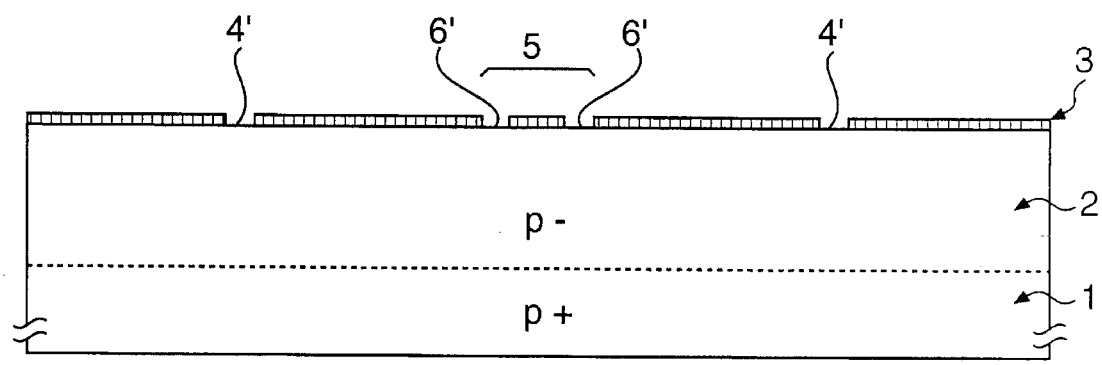
FIG. 1 is a sectional view illustrative of a initial step in the process for producing a semiconductor device according to a preferred embodiment of the invention.
Figure 2:
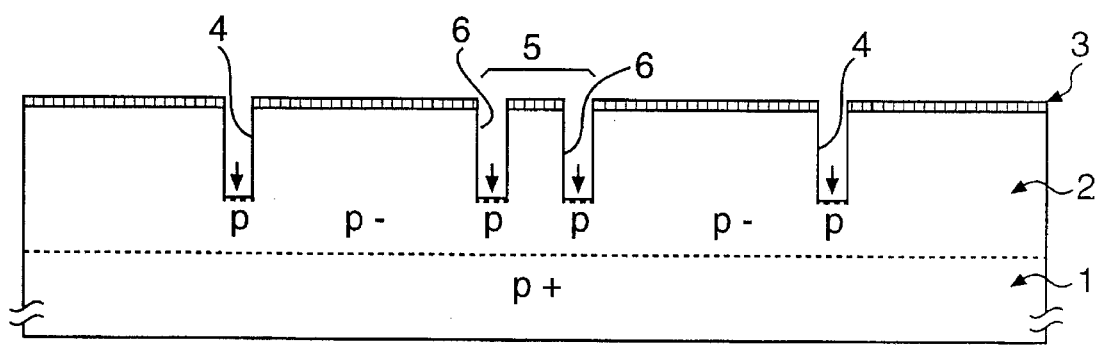
FIGS. 2, 3 and 4 are sectional views illustrative of a successive steps in the process of producing a semiconductor device according to the preferred embodiment.

FIG. 1 illustrates a $p^+$-type (high impurity density p-type) silicon wafer 1 and a $p^-$-type (low impurity density p-type) epitaxial layer 2 formed thereon. A photoresist layer 3, serving as a mask layer, is disposed on the surface of $p^-$-type epitaxial layer 2. Window openings 4' are formed in photoresist layer 3. Window openings 4' are used for forming trench grooves for element separation or isolation. Moreover, a plurality of linear window openings 6' are formed in the photoresist layer 3 for subsequent formation of dummy etched grooves in scribe line zone 5 (for use when the $p^+$-type silicon wafer 1 is cut and divided). Window opening 4' for forming the trench groove and window opening 6' for forming the dummy etched groove are both 3 μm wide. In addition, linear window openings 6' are formed in such a way that the sum of their areas and the areas of the window openings 4' accounts for not less than 5% of the total surface area on the surface $p^+$-type silicon wafer 1. By way of example, FIGS. 1–4 only show a pair of linear window openings 6' and a pair of dummy etched grooves 6. However, any appropriate number of such window openings and dummy etched grooves may be provided.

Figure 5:
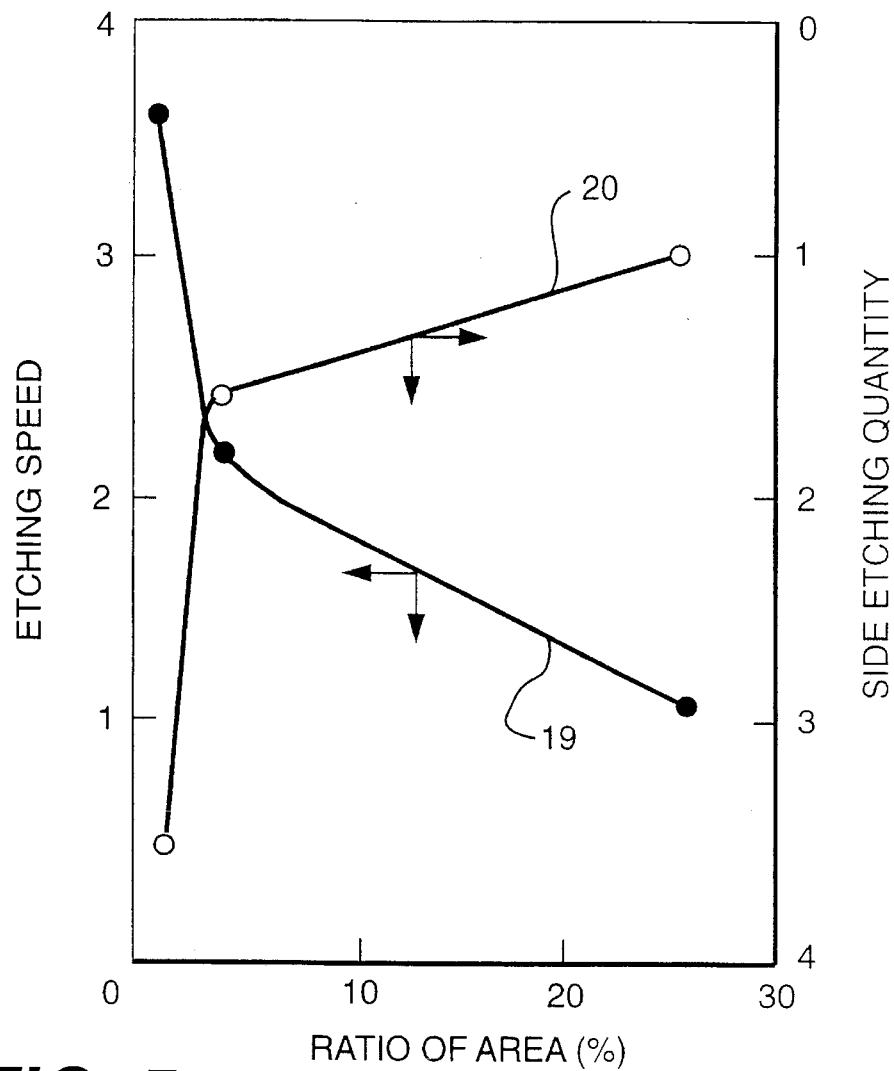
FIG. 5 is a graphic representation illustrating the relationship between the percentage of area to be etched on a silicon wafer; relative to the total surface area of the wafer the etching speed; and the side etching quantity.

FIG. 5 illustrates the relationship between the ratio of the sum of the areas of window openings 6' and window openings 4' to the total wafer surface area; etching speed associated with plasma etching; and the side etching quantity associated with plasma etching.

Curve 19 represents the relation between the percentage of the area to be etched and the etching speed and a curve 20 represents the relation between the percentage thereof and the side etching quantity.

As the percentage of the area to be etched increases, the etching speed decreases and so does the side etching quantity as shown in FIG. 5. The effect of decreasing the side etching quantity is particularly noticeable when the area etched is 5% or greater. Accordingly, a plurality of window openings 6' are formed, so that the area to be etched accounts for 5% or more of the total surface area.

Figure 6:
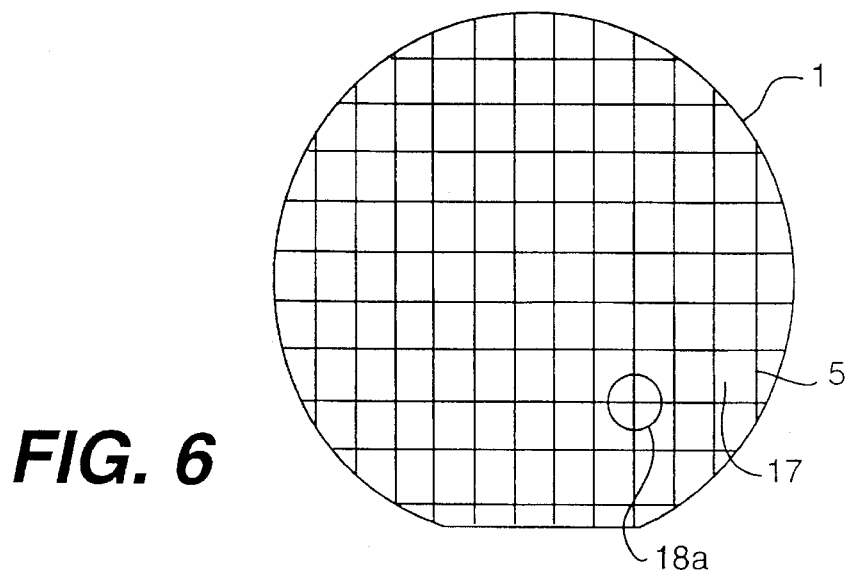
FIG. 6 is a top view of a scribe line zone of the silicon wafer used in the preferred embodiment of the present invention.
Figure 7:
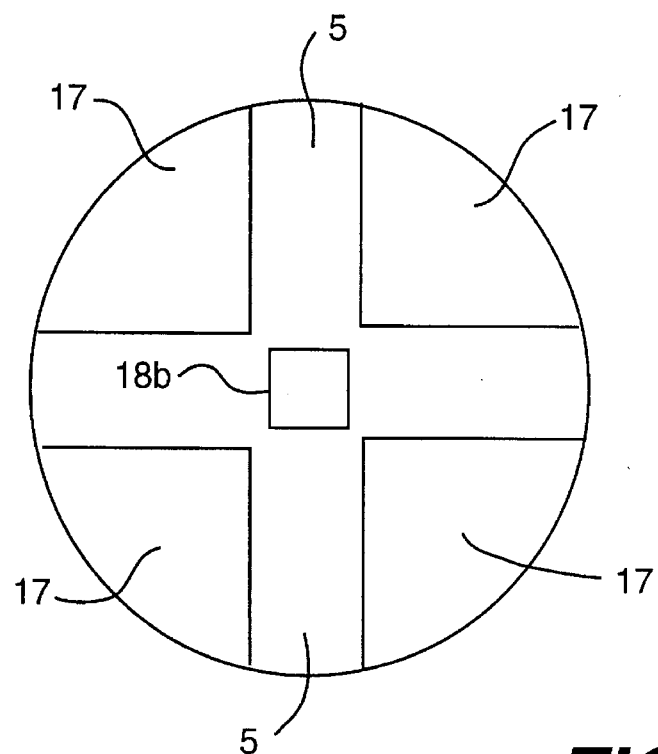
FIG. 7 is an enlarged top view of the scribe line zone shown in FIG. 6.
Figure 8:
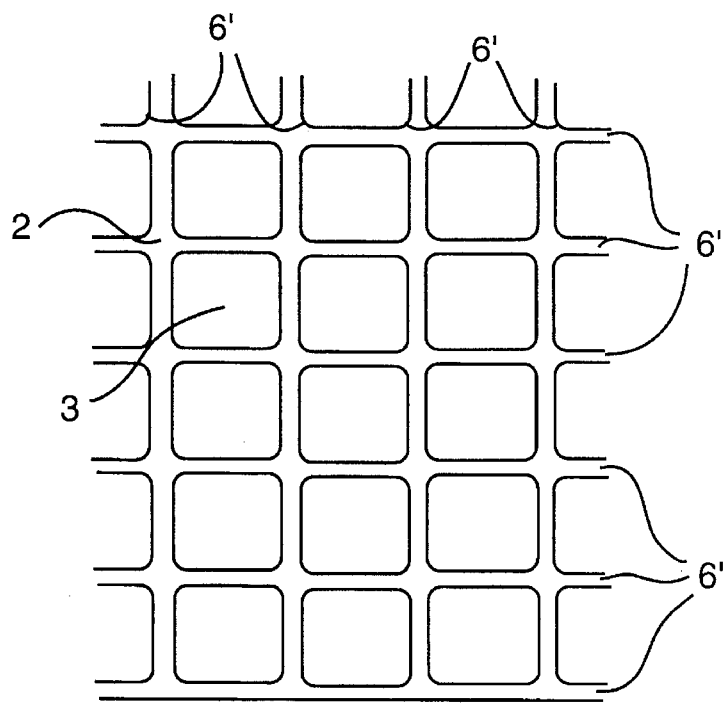
FIG. 8 is an enlarged view of the scribe line zone, illustrating a mask pattern having window openings for forming dummy etched grooves.
Figure 9:
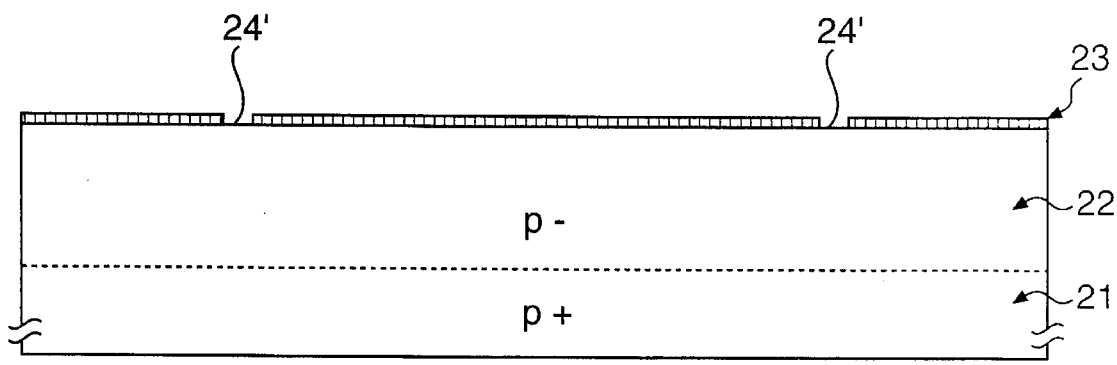
FIG. 9, 10, 11 and 12 are sectional views illustrative of conventional processing steps for manufacturing a semiconductor device.
Figure 10:
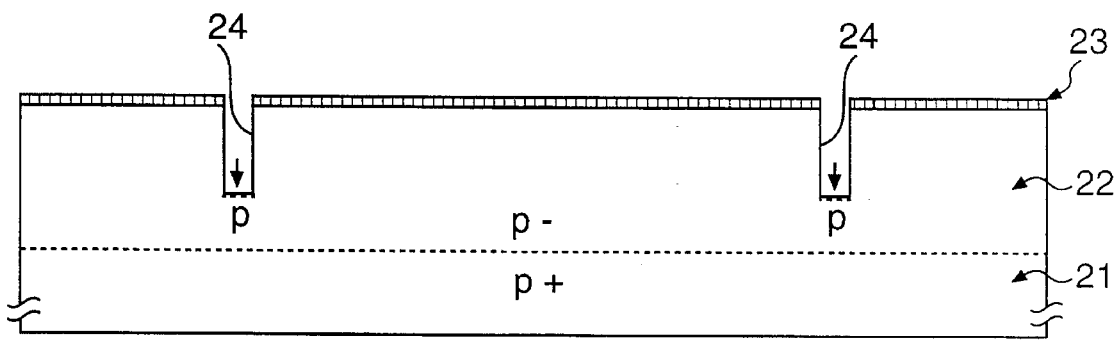
Figure 11:
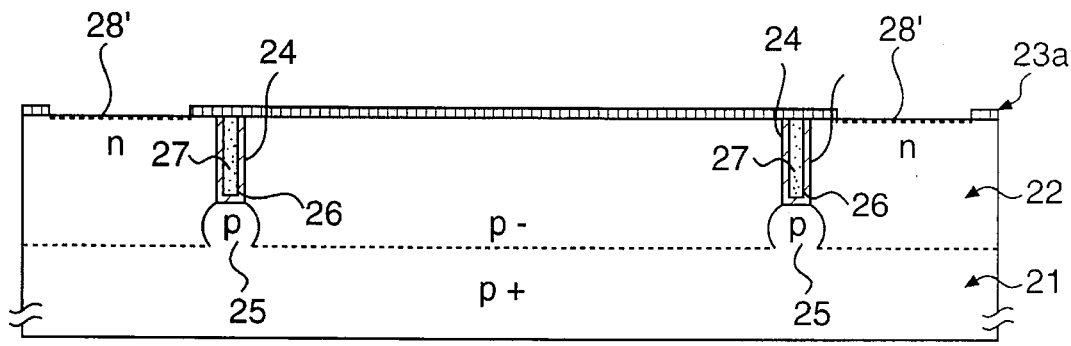
Figure 12:
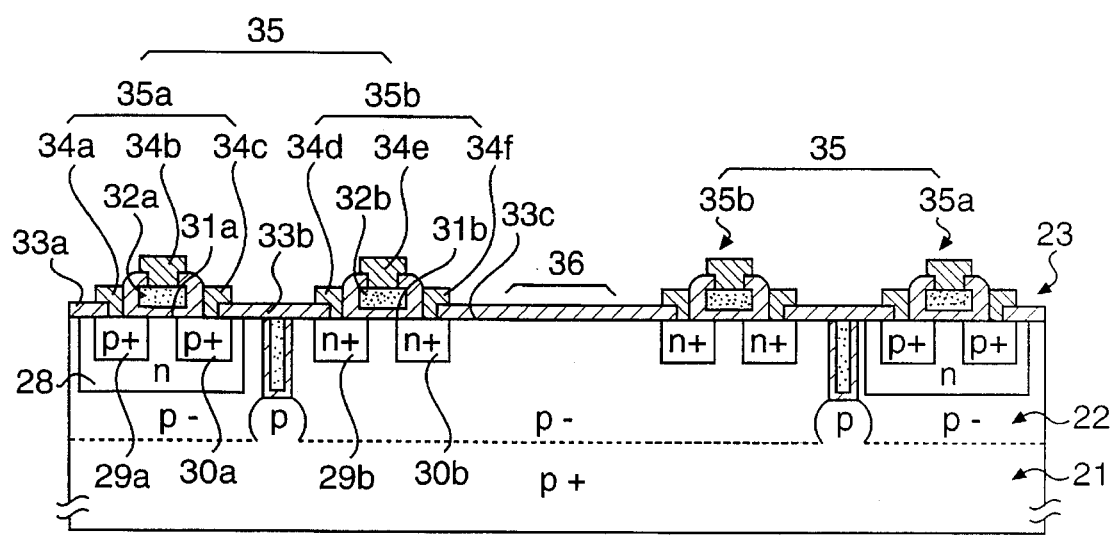

Referring to FIGS. 6–8, a description will further be made of how scribe line zone 5 of $p^+$-type epitaxial silicon wafer 1 is arranged. Description will further be made of the mask pattern of window openings 6' for forming the dummy etched grooves in the zone 5.

FIG. 6 is a top view of the scribe line zone of a 4-inch $p^+$-type silicon wafer 1 used in the preferred embodiment. FIG. 7 is an enlarged top view of a portion at an intersection (a circular portion 18a of FIG. 6). FIG. 8 is a further enlarged view of scribe line zone 5 (square portion 18b of FIG. 7) illustrating a mask pattern of window openings 6'.

As shown in FIGS. 6 to 8, scribe line zone 5, which is 200–500 μm wide, is arranged in the form of a grid so as to divide the wafer into chips upon which semiconductor devices or integrated circuits are formed. In this case, window openings 6' for forming the dummy etched grooves have a microminiature grid-like pattern and are formed as a plurality of microminiature linear grooves in scribe line zone 5.

Mask layer 3 is disposed on $p^-$-type epitaxial layer 2. Window openings 4', 6' are then formed in mask layer 3. Exposed portions of $p^-$-type epitaxial layer 3 are then etched by plasma etching in an atmosphere containing fluorine gas to form trench grooves 4 and dummy etched grooves 6 shown in FIG. 2. Window openings 6' for forming the dummy etched groove 6 and window openings 4' for forming trench groove 4 are substantially similar. For example, dummy etched grooves 6 and trench grooves 4 are about 6 μm wide and have substantially the same depth.

Preferred plasma etching processing conditions are listed in Table 1.

TABLE 1

| Flow rate of gas (sccm) | $SF^6$:5–10 | $O^2$:1–10 |
|---|---|---|
| High frequency output (W) | 50–100 | |
| Etching pressure (Torr) | 0.01–1 | |
| Depth of groove (μm) | 5–50 | |

Figure 3:
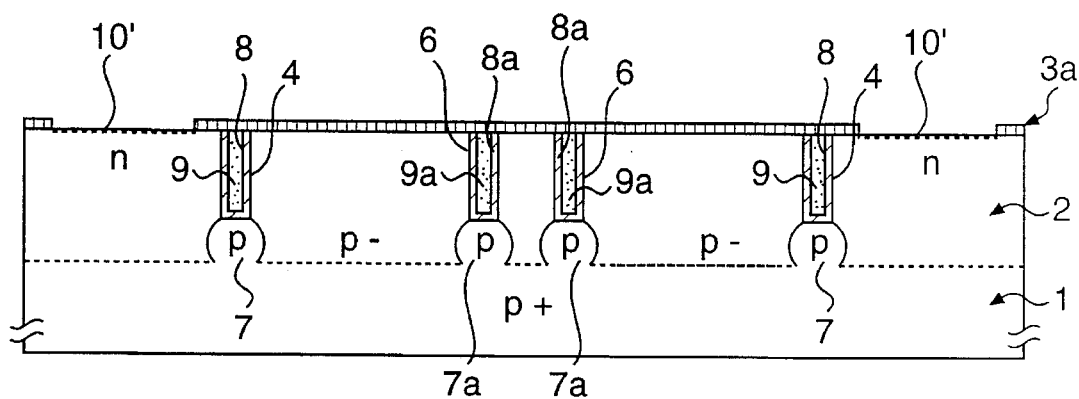

Subsequently, boron ions are implanted onto the bottoms of the trench grooves 4 to form respective channel stop layers 7 shown in FIG. 3. At this time, the boron ions are also injected or implanted onto the bottoms of the dummy etched grooves 6 to form p-type semiconductor layers 7a similar to channel stop layers 7.

Then sidewall insulating film 8 is formed having a thickness of 1 μm. Sidewall insulating film 8 is formed on the inner sidewall of each trench groove 4, and a sidewall insulating film 8a is similarly formed on the inner sidewall of each dummy etched groove 6. Trench grooves 4 are then completely filled with polycrystalline silicon 9 so that the top portion of the polysilicon is even with the surface of epitaxial layer 2. Dummy etched grooves 6 and trench grooves 4 are filled in simultaneously. Since dummy etched grooves 6 are as wide and deep as trench grooves 4, the dummy grooves are filled with polycrystalline silicon at the same rate as the trench grooves. Therefore, dummy etched grooves 6 are completely filled with polycrystalline silicon at the same point in time that filling trench grooves 4 are completely filled. Then photoresist layer 3a is formed on the flattened surface of the $p^-$-type epitaxial layer 2 and patterned to form window openings 10'. Phosphorus ions are implanted through window openings 10' to form n-well regions 4 in which p-channel transistors will be subsequently formed.

Figure 4:
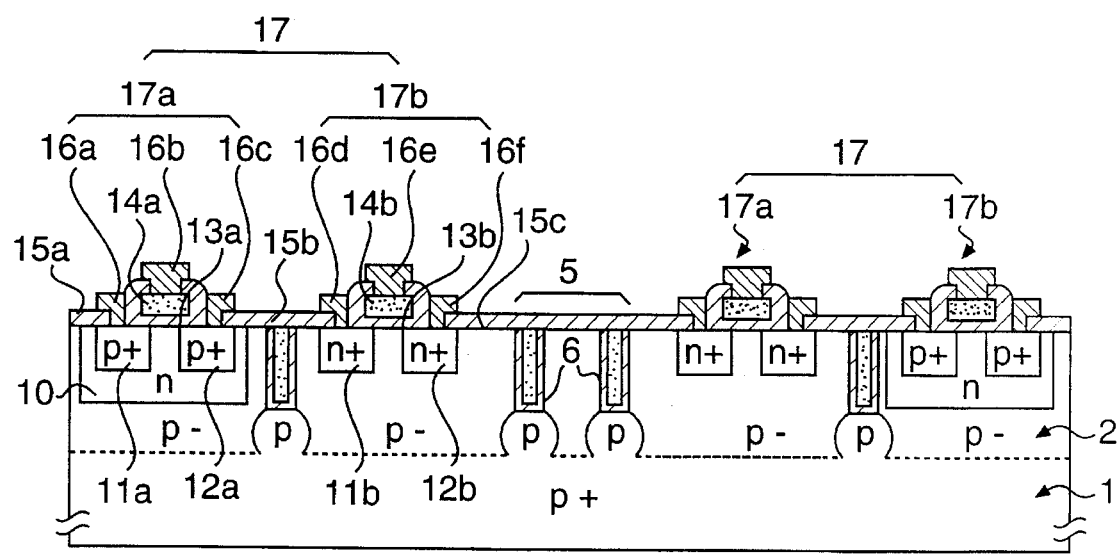

After n-wells 10 are formed as shown in FIG. 4, $p^+$-type source and drain regions 11a and 12a are conventionally formed in n-well 10, and $n^+$-type source and drain regions 11b and 12b area formed in $p^-$-type epitaxial layer 2. Gate oxide films 13a, 13b, gate electrodes 14a, 14b and layer-to-layer insulating films 15a, 15b, 15c are then formed in subsequent steps. Aluminum electrodes 16a, 16b, 16c, 16d, 16e and 16f are then formed to provide appropriate electrical connections as shown in FIG. 4. In this way, p-channel MOS transistors 17a and n-channel MOS transistors 17b are formed.

Then a blade or scribe is placed on the scribe line zone 5 where the dummy etched grooves 6 have been formed to cut and divide the $p^+$-type silicon wafer 1 into semiconductor chips 17.

As set forth above, according to the preferred embodiment, trench grooves 4 in the element formation zones and dummy etched grooves 6 in areas of the wafer not containing elements (e.g., the scribe line zone) are formed simultaneously by plasma etching. Since dry etching is performed on a wafer having a large etchable area, the ratio of etching area to the concentration of fluorine ions or radicals (etching species) in the plasma etching atmosphere is kept high. Consequently, the side etching quantity can be reduced significantly so that it is possible to form microminiature trench grooves 4 which are uniform in configuration and size. Accordingly, high density can be achieved. Since dummy etched grooves 6 are formed in scribe line zone 5, it is not necessary to provide an additional zone in semiconductor chip 17 to form the dummy etched grooves. Therefore, even if dummy etched grooves 6 cover a wide area, a high density of semiconductor devices can be achieved.

Since the dummy etched grooves 6 are filled with polycrystalline silicon, the following problems are prevented. For example, reliability of the semiconductor devices are not lowered because of the photoresist material left on the uneven surface, e.g., an open groove. A smooth photoresist layer does not fail to form in secondary processes (e.g., when the well regions are formed) due to the presence of a rough surface. In addition, dummy etched grooves 6 and trench grooves 4 are equal in width and depth. When these grooves are respectively filled with polycrystalline silicon 9, 9a, dummy etched grooves 6 are simultaneously filled up with polycrystalline silicon when the operation of filling up the trench grooves is completed. In other words, these grooves are readily filled up in the same process step.

Although, according to the above-described embodiment the trench grooves are formed in the etching sections of the element formation zones and the dummy etched grooves in the scribe line zone, the present invention is not limited to this groove configuration. Microminiature etching sections may simply be formed in element formation zones and the dummy etching sections may be formed outside these element formation zones.

Although plasma etching has been employed as the dry etching process of the embodiment described above, reactive ion etching or any other anisotropic etch exhibiting significant directivity may be implemented.

As stated above, the process of producing a semiconductor device according to the present invention comprises the steps of forming the mask layer in such a manner that windows are made in the etching sections of the element formation zones on the surface of the semiconductor wafer and dummy etching sections are provided in zones other than the element formation zones of the wafer; and performing dry etching in all the sections having the windows made in the mask layer disposed on the surface of the semiconductor wafer. Therefore, the following effects can be achieved:

Side etching can be reduced because the ratio of the total area of the etching sections to the concentration of ion or radical species used in dry etching is increased significantly. Since the microminiature etching sections having a constant configuration can be formed, a scheme for increasing the density of elements can be realized.

Since it is unnecessary to provide another zone for forming dummy etching sections on the surface of a substrate when the dummy etching sections are formed within a scribe line zone dividing a semiconductor wafer, further integration of circuit elements can be achieved.

The effect of reducing side etching is achieved noticeably when window openings are provided in such a way that the sum of the area of dummy etching sections and the area to be etched in the element formation zones accounts for not less than 5% of the total area on a surface of the semiconductor wafer. The method according to the present invention can be implemented with an overall processing scheme for producing integrated circuits having a high device density.

Since the surface of a substrate is made even when the etched dummy sections are filled, secondary or subsequent processes can be performed easily.

When the operation of filling up trench grooves is utilized for filling up dummy etched grooves, no additional process step is necessary to fill up the dummy etched grooves provided that trench grooves are formed in the etchings section of the element formation zones.

Since dummy etched grooves and trench grooves can be made substantially equal in depth and width, both the trench and dummy etched grooves can be filled completely and simultaneously. Therefore, the surface of the wafer can be readily smoothed in one processing step.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of making a plurality of individual integrated circuit chips from a semiconductor wafer, said wafer having a major surface and the major surface having a total surface area, said method comprising the steps of:

depositing a mask layer on the major surface of said semiconductor wafer to expose a plurality of portions of a first area of the major surface and a plurality of portions of a second area of the major surface, said plurality of portions of the second area of the major surface for isolating circuit elements of each said integrated circuit chip, said circuit elements being formed in regions of the major surface other than said first area, a sum of the portions of the first area and the portions of the second area is at least 5% of the total surface area of the major surface;

dry etching material from said portions of said first and second areas simultaneously to form element isolation trenches in said second areas and dummy trenches in said first areas, a width of said element isolation trenches being substantially equal to a width of said dummy trenches; and separating said semiconductor wafer into individual chips.

2. The method of claim 1 wherein said step of separating said semiconductor wafer into individual chips includes the step of scribing said first area of the major surface.

3. The method of claim 1 further comprising the step of filling at least said dummy trenches in said at least one portion of said first area with material selected from the group of semiconductor, dielectric and conductor.

4. The method of claim 3 further comprising the step of filling said isolation trenches in said at least one portion of said second area with material selected from the group of semiconductor, dielectric and conductor simultaneously with the step of filling said dummy trenches in said at least one portion of said first area.

* * * * *